(12) United States Patent
Kim et al.

(10) Patent No.: US 11,470,735 B2
(45) Date of Patent: Oct. 11, 2022

(54) FOLDABLE DISPLAY DEVICE AND HINGE DEVICE THEREFOR

(71) Applicant: Samsung Display Co., LTD., Yongin-si (KR)

(72) Inventors: Se Yong Kim, Yongin-si (KR); In Soo Park, Yongin-si (KR); Jin Yong Sim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 190 days.

(21) Appl. No.: 16/906,598

(22) Filed: Jun. 19, 2020

(65) Prior Publication Data
US 2021/0120687 A1    Apr. 22, 2021

(30) Foreign Application Priority Data
Oct. 22, 2019   (KR) .................. 10-2019-0131642

(51) Int. Cl.
| | |
|---|---|
| *G06F 1/16* | (2006.01) |
| *H05K 5/02* | (2006.01) |
| *H05K 5/00* | (2006.01) |
| *E05D 11/02* | (2006.01) |
| *E05D 11/00* | (2006.01) |

(52) U.S. Cl.
CPC .......... *H05K 5/0226* (2013.01); *E05D 11/00* (2013.01); *E05D 11/02* (2013.01); *H05K 5/0017* (2013.01); *E05Y 2900/606* (2013.01)

(58) Field of Classification Search
CPC .... G06F 1/1652; G06F 1/1681; H05K 5/0226
See application file for complete search history.

(56) References Cited

U.S. PATENT DOCUMENTS

| | | | |
|---|---|---|---|
| 10,664,021 B1* | 5/2020 | Hsu ........................ | G06F 1/1681 |
| 2018/0324964 A1 | 11/2018 | Yoo et al. | |
| 2020/0409427 A1* | 12/2020 | Hsu ........................ | G06F 1/1641 |
| 2020/0409429 A1* | 12/2020 | Hsu ........................ | G06F 1/1616 |
| 2021/0116971 A1* | 4/2021 | Feng ........................ | G09F 9/301 |

FOREIGN PATENT DOCUMENTS

| | | |
|---|---|---|
| KR | 10-1861602 | 5/2018 |
| KR | 10-2018-0122210 | 11/2018 |

\* cited by examiner

*Primary Examiner* — Anthony Q Edwards
(74) *Attorney, Agent, or Firm* — Kile Park Reed & Houtteman PLLC

(57) ABSTRACT

A foldable display device includes a display panel including a foldable display area, and a first panel support member supporting the display panel, the first panel support member overlapping a first area of the display panel. The foldable display device includes a second panel support member supporting the display panel, the second panel support member overlapping a second area of the display panel, and a hinge device including base hinge devices coupled to the first panel support member and the second panel support member to guide folding and unfolding of the display panel with respect to virtual rotation axes.

20 Claims, 9 Drawing Sheets

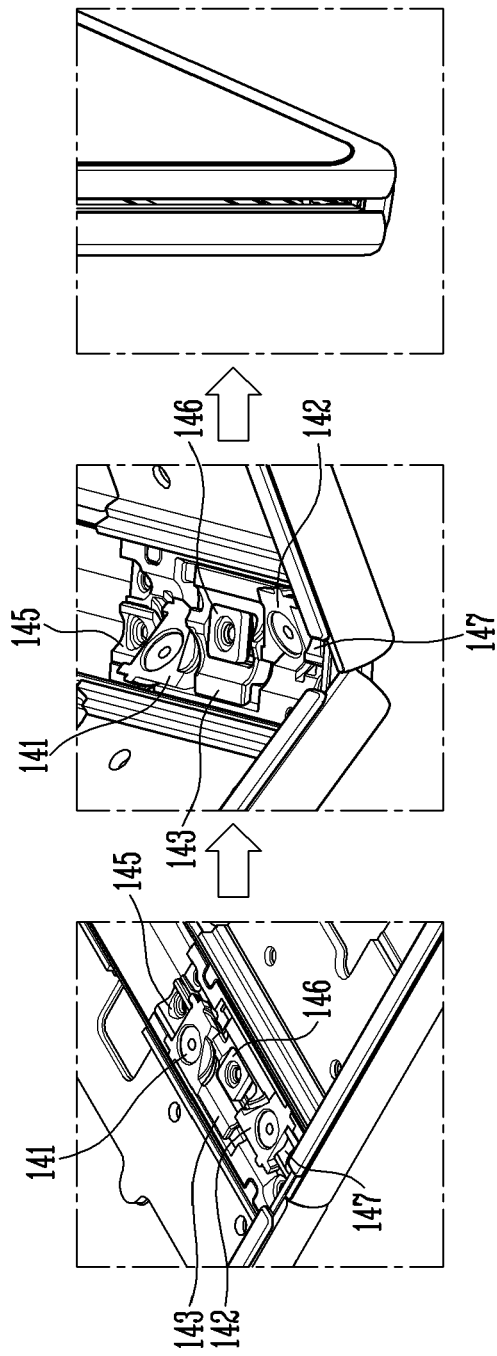

FOLDABLE DISPLAY DEVICE AND HINGE DEVICE THEREFOR

CROSS-REFERENCE TO RELATED APPLICATION(S)

This application claims priority to and benefits of Korean Patent Application No. 10-2019-0131642 under 35 U.S.C. § 119, filed in the Korean Intellectual Property Office on Oct. 22, 2019, the entire contents of which are incorporated herein by reference.

BACKGROUND

1. Technical Field

The disclosure relates to a foldable display device and a hinge device therefor.

2. Description of the Related Art

Display devices may serve to connect users and information. As information technology continues to develop, the importance of display devices is emphasized. Accordingly, use of display devices such as liquid crystal display devices, organic light emitting display devices, and plasma display devices has been increasing.

Recently, research and development of foldable display devices, bendable display devices, rollable display devices, and the like are in progress. Such devices provide advantages of a flexible display panel that may be bent or folded. Such display devices may be applied to a variety of devices, such as a television and a monitor as well as a portable electronic apparatus and a wearable apparatus.

A foldable display device may be implemented according to an in-folding method in which display surfaces may be folded to face each other, or according to an out-folding method in which the display surfaces may be folded outwardly.

A foldable display device may include a hinge device for assisting in folding and supporting a folded shape and/or an unfolded shape of the foldable display device. Research and development of hinge devices having reduced manufacturing cost while precisely assisting in the folding/unfolding of a foldable display device are in progress.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In an embodiment provided is a foldable display device that may control folding and unfolding of a display panel through a rotational movement of a rotor.

In another embodiment provided is a hinge device that may include a rotor that performs a smooth rotational movement using a groove and a follower that performs a linear movement by the rotor.

However, embodiments are not limited thereto. Other embodiment are disclosed and may be variously expanded within a range without departing from the spirit and scope of the disclosure.

In an embodiment, a foldable display device may include a display panel that may include a foldable display area, and a first panel support member supporting the display panel, the first panel support member overlapping a first area of the display panel. The foldable display device may include a second panel support member supporting the display panel, the second panel support member overlapping a second area of the display panel. The foldable display device may include a hinge device including base hinge devices coupled to the first panel support member and the second panel support member to guide folding and unfolding of the display panel with respect to virtual rotation axes.

In an embodiment, a hinge device may further include a first base plate coupled to the first panel support member, a second base plate coupled to the second panel support member, and a hinge cover supporting the base hinge devices.

Each of the base hinge devices may include a first rotor coupled to the first base plate to rotate along a first virtual rotation axis of the virtual rotation axes, and a second rotor coupled to the second base plate to rotate along a second virtual rotation axis of the virtual rotation axes.

Each of the base hinge devices may further include a bracket supporting the first rotor and the second rotor on an inner side surface of the hinge cover and guiding a rotational movement of the first rotor and the second rotor.

The bracket may include one of polyoxymethylene (POM) and stainless steel (STS).

The base hinge devices may include a first base hinge device including the first rotor that includes a curved surface having a diameter corresponding to the first rotation axis, and a groove recessed in an arc shape on the curved surface.

The groove of the first rotor may be fitted to the bracket.

The first rotor may have a shape bent along a rotation radius corresponding to the first rotation axis, and the first rotor may include a torque assist member extending in a direction parallel to the first rotation axis from a side surface of the first rotor.

At least one surface of the torque assist member may include grooves.

The second rotor included in the first base hinge device may have the same shape as the first rotor and may be disposed on the bracket so as to be rotationally symmetrical to the first rotor.

The first base hinge device may further include an auxiliary bracket disposed between the first rotor and the second rotor and overlapping at least a portion of the torque assist member of the first rotor and at least a portion of a torque assist member of the second rotor.

The first base hinge device may further include a lubricant applied between the auxiliary bracket and the torque assist member of the first rotor or the second rotor.

The base hinge devices may include a second base hinge device including a first rotor that includes a curved surface having a diameter corresponding to the first rotation axis, and a surface protruding in an arc shape on the curved surface.

The first rotor included in the second base hinge device may further include a torque assist member having a shape bent along a rotation radius corresponding to the first rotation axis and extending in a direction parallel to the first rotation axis from a side surface of the first rotor.

A side surface opposite to the side surface to which the torque assist member may be coupled in the first rotor may have a cross section of a spiral shape, which may be cut in a diagonal direction.

The cross section of the spiral shape may have a groove of an arc shape along the first rotation axis.

The second base hinge device may further include a follower that may be fitted to the groove of the cross section of the spiral shape of the first rotor, and may be pushed by the rotational movement of the first rotor to linearly move in a direction horizontal to the first rotation axis.

The second rotor included in the second base hinge device may have a shape symmetrical to the first rotor with respect to the follower, and may be disposed on a side opposite to the first rotor.

The second rotor may convert force according to the linear movement of the follower into a rotational force to rotate in a direction opposite to a rotation direction of the first rotor.

The first rotor and the second rotor may simultaneously rotate oppositely by a same angle.

An aspect of the disclosure for achieving the above provides a hinge device for a foldable display device.

The hinge device for the foldable display device may include a first base plate coupled to a first panel support member, a second base plate coupled to a second panel support member, and base hinge devices coupled to the first panel support member and the second panel support member. The hinge device may include a hinge cover supporting the base hinge devices, wherein each of the base hinge devices may include a first rotor coupled to the first base plate to rotate along a first virtual rotation axis, a second rotor coupled to the second base plate to rotate along a second virtual rotation axis, and a bracket supporting the first rotor and the second rotor on an inner side surface of the hinge cover and guiding a rotational movement of the first rotor and the second rotor.

The foldable display device and the hinge device therefor according to the disclosure may be advantageous in assembly and production management through modularization by configuring an inside of the hinge device in a part of the base hinge devices.

Both screen angles by folding and unfolding operations may be linked and symmetric to each other by disposing a follower performing the linear movement between the rotors. The linear movement may be easily performed while minimizing wear due to friction by additionally disposing a fixed type bracket at a lower end the rotor and the follower.

The rotor may include a groove structure, and thus torque required for rotation may be easily generated. Thus, a natural folding or unfolding operation may be implemented.

However, the effects of the disclosure are not limited to the above-described effects, and may be variously expanded within a range without departing from the spirit and scope of the disclosure.

BRIEF DESCRIPTION OF THE DRAWINGS

The above and other features of the disclosure will become more apparent by describing in further detail embodiments thereof with reference to the accompanying drawings, in which:

FIG. 9 is a schematic diagram for describing a folding operation of a third base hinge device according to an embodiment of the disclosure.

DETAILED DESCRIPTION OF THE EMBODIMENTS

Figure 1:
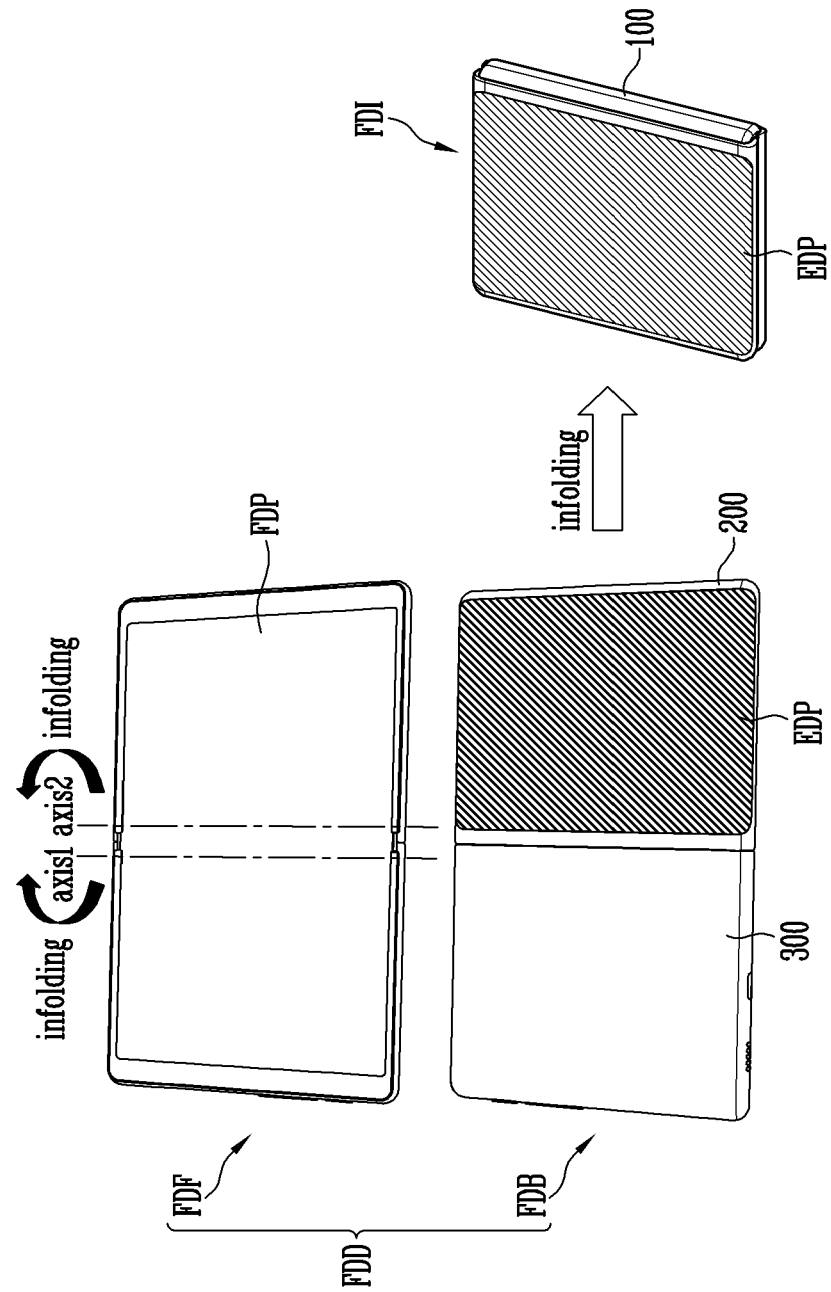
FIG. 1 is a schematic diagram for describing an appearance of a foldable display device according to an embodiment of the disclosure.

Hereinafter, various embodiments of the disclosure will be described in detail with reference to the accompanying drawings so that those skilled in the art may easily carry out the disclosure. The disclosure may be implemented in various different forms and is not limited to the embodiments described herein.

In order to clearly describe the disclosure, parts that may be not related to the description may be omitted, and the same or similar components may be denoted by the same reference numerals throughout the specification and drawings.

The terms "comprises", "comprising", "includes", "including", "has", "have", "having", and the like, specify the presence of stated components, but do not preclude the presence or addition of one or more other components.

Sizes and thicknesses of each component shown in the drawings may be arbitrarily shown for convenience of description, and thus the disclosure is not necessarily limited to those shown in the drawings. In the drawings, thicknesses may be exaggerated to clearly express various layers and regions.

The term "overlap" may include "layer," "stack," "face" or "facing," "extending over," "covering" or "partly covering" or any other suitable term as would be appreciated and understood by those of ordinary skill in the art.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

FIG. 1 is a schematic diagram for describing an appearance of a foldable display device according to an embodiment of the disclosure.

Referring to FIG. 1, the foldable display device FDD may include a first surface (or front surface portion FDF) and a second surface (or back surface portion FDB).

The front surface portion FDF of the foldable display device FDD may be a direction in which a display panel FDP having a foldable display area may be exposed (e.g., a front surface portion FDF may be a surface from which an image of the display panel FDP is viewed). The display panel FDP may be a flexible display panel. For example, the display panel FDP may include a flexible substrate such as a plastic film, and may display an image using a pixel circuit (multiple transistors) and a light emitting element such as an organic light emitting diode disposed on the flexible substrate. The light emitting element and the pixel circuit may be covered by a thin film encapsulation layer. The thin film encapsulation layer may seal the light emitting element from an external air environment including water and oxygen, thereby suppressing characteristic deterioration. The light emitting element is not limited to the organic light emitting diode. For example, the light emitting element may be an inorganic light emitting element including an inorganic light emitting material or a light emitting element (quantum dot display element) that emits light by changing a wavelength of light emitted using a quantum dot.

The foldable display area of the display panel FDP may include pixels, and may include at least one of an area that may be bent by a folding operation and an area that may not be bent. In an embodiment of the disclosure, the foldable display device FDD may be folded in an in-folding method in which the foldable display areas may be folded to face each other. More specifically, the foldable display device FDD may be folded so that left and right surfaces of the foldable display area face each other using two virtual rotation axes axis1 and axis2. Hereinafter, for convenience of description, the description will be given on the premise that the foldable display area may be folded in the in-folding method. However, the foldable display area may be folded in an out-folding method.

The foldable display device FDD may further include an input sensing sensor disposed on the foldable display area of the display panel FDP or embedded in the display panel FDP. The input sensing sensor may include a touch sensor, a fingerprint sensor, a movement sensor, an iris sensor, and the like.

A transparent cover window may be provided on the foldable display area of the display panel FDP. The cover window may protect the display panel FDP from an external impact, a scratch, and the like while transmitting the image of the display panel FDP. The cover window may include a transparent material having rigidity and flexibility.

The back surface portion FDB of the display panel FDP may be supported by panel support members 200 and 300. Referring to the back surface portion FDB of the foldable display device FDD, the panel support members 200 and 300 may be exposed on a back surface of the foldable display device FDD. The foldable display device FDD may further include a back surface display panel EDP. The back surface display panel EDP may be coupled to at least one of the panel support members 200 and 300 on an opposite side of the display panel FDP. The back surface display panel EDP may be a display panel that may not be folded. However, the disclosure is not limited thereto, and the display panel EDP of the back surface portion FDB may be a flexible display panel.

Referring to the foldable display device FDD in a folded state FDI, a hinge device 100 that guides folding and unfolding of the foldable display device may be exposed to the outside. On the other hand, referring to the back surface portion FDB of the foldable display device FDD, the two panel support members 200 and 300 may be in contact with each other while surrounding both sides of the hinge device 100 in case that the foldable display device FDD in an unfolded state (or a flat state).

Therefore, the hinge device 100 according to the embodiment of the disclosure may be implemented in a form in which the hinge device 100 may be covered by the panel support members 200 and 300 and may not be exposed to the outside in the unfolded state (or flat state) and the hinge device 100 may be exposed to the outside in the folded state FDI. However, the disclosure is not limited thereto, and the hinge device 100 may be implemented in a form in which the hinge device 100 may not be exposed to the outside even in the folded state.

Figure 2:
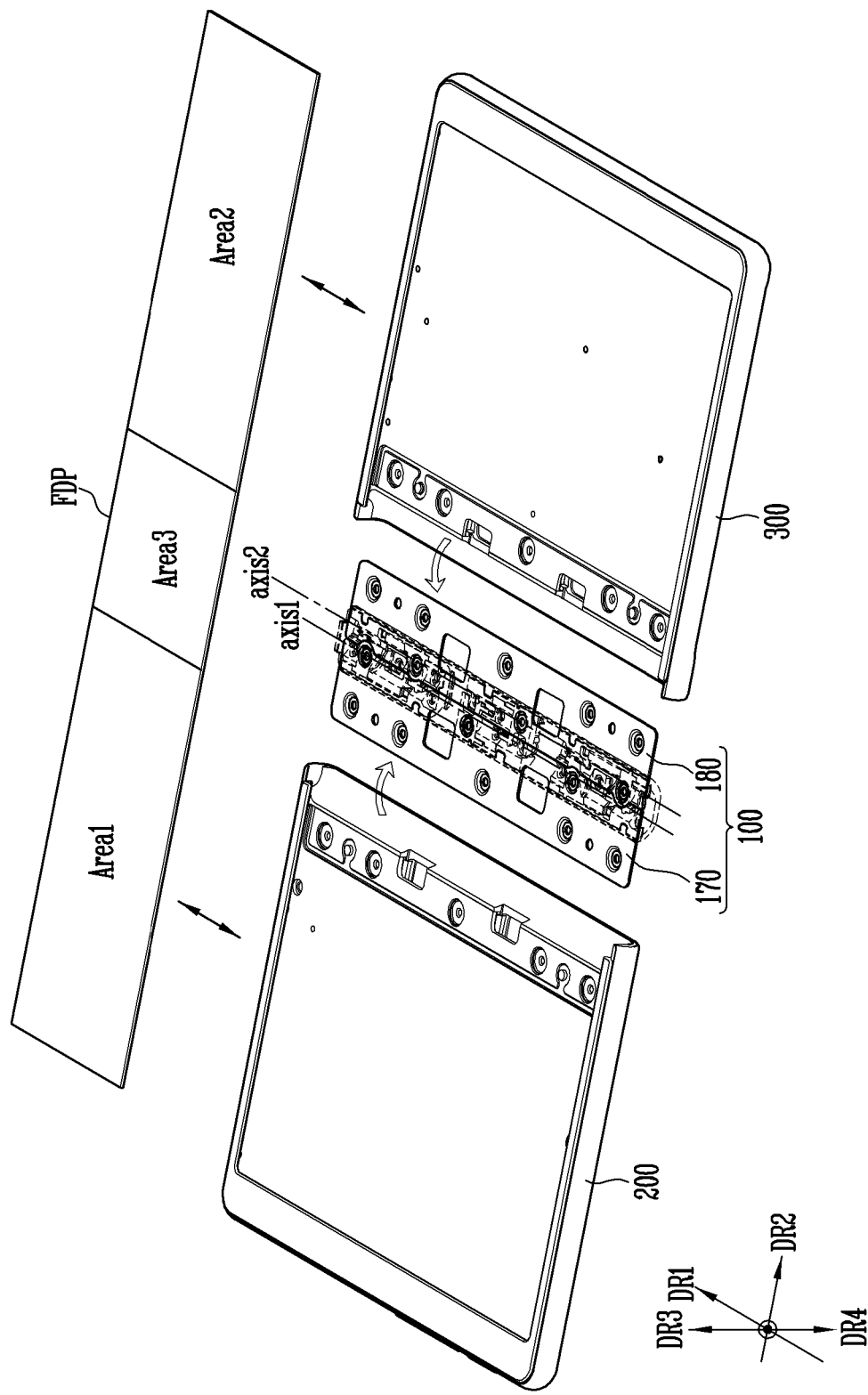
FIG. 2 is a schematic diagram illustrating a coupling relationship between a hinge device and panel support members in a foldable display device according to an embodiment of the disclosure.

FIG. 2 is a schematic diagram illustrating a coupling relationship between a hinge device and panel support members in a foldable display device according to an embodiment of the disclosure.

Referring to FIG. 2, the foldable display device may include the display panel FDP, the first panel support member 200, the second panel support member 300, and the hinge device 100.

The display panel FDP may include the foldable display area.

The first panel support member 200 may overlap a first area Area1 of a back surface side of the display panel FDP to support the display panel FDP. A direction in which a screen may be displayed on the display panel FDP may be defined as a front surface side direction DR3, and a direction opposite to the front surface side direction DR3 may be defined as a back surface side direction DR4 of the display panel FDP.

A direction parallel to the first rotation axis 1 in which the first panel support member 200 rotates by the hinge device 100 and the second rotation axis 2 in which the second panel support member 300 rotates by the hinge device 100 may be defined as a first direction DR1, and a direction perpendicular to the first direction DR1 on a horizontal plane (for example, a plane parallel to the display panel) may be defined as a second direction DR2.

However, the first direction DR1, the second direction DR2, the front surface side direction DR3, and the back surface side direction DR4 shown in FIG. 2 are exemplary, and may be converted to other directions satisfying relative directions.

The second panel support member 300 may overlap a second area Area2 of a back surface side of the display panel FDP to support the display panel FDP. For example, the second panel support member 300 may include the second area Area2 of the display panel FDP thereon.

In an embodiment, the first panel support member 200 and the second panel support member 300 may be attached to the display panel FDP by an adhesive. The first panel support member 200 and the second panel support member 300 may include a flexible PCB (FPCB), a battery, a speaker, and the like for driving and/or operating the foldable display device.

The hinge device 100 may be coupled to the first panel support member 200 and the second panel support member 300 to guide the folding and unfolding of the display panel FDP with respect to the two virtual rotation axes axis1 and axis2, as will be described more later.

The hinge device 100 may include a first base plate 170 coupled to the first panel support member 200 and a second base plate 180 coupled to the second panel support member 300. Therefore, the first panel support member 200 and the first base plate 170 may be rotated (or folded and unfolded) dependently on each other, and the second panel support member 300 and the second base plate 180 may also be rotated (or folded and unfolded) dependently on each other. The first base plate 170 and the second base plate 180 may be symmetrically rotated at the same time.

The first base plate 170 may include fastening holes for coupling to the first panel support member 200. The second base plate 180 may include fastening holes for coupling to the second panel support member 300.

The first base plate 170 and the second base plate 180 may be in contact with each other at one side surface of the hinge device 100 to form a flat surface, and may support a third area Area3 of the display panel FDP using the formed flat surface. Here, the third area Area3 may include an area in which the folding and the unfolding may be possible in the foldable display area.

Figure 3:
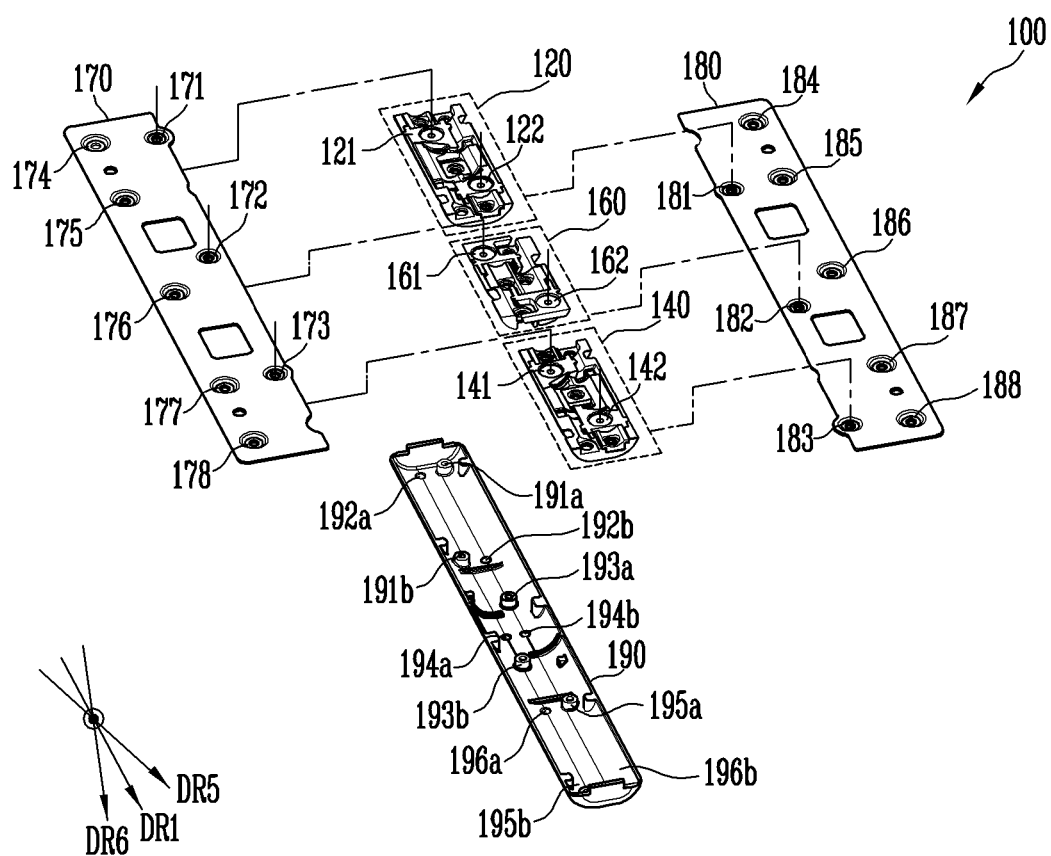
FIG. 3 is an exploded schematic perspective view for describing components of a hinge device according to an embodiment of the disclosure.
Figure 4:
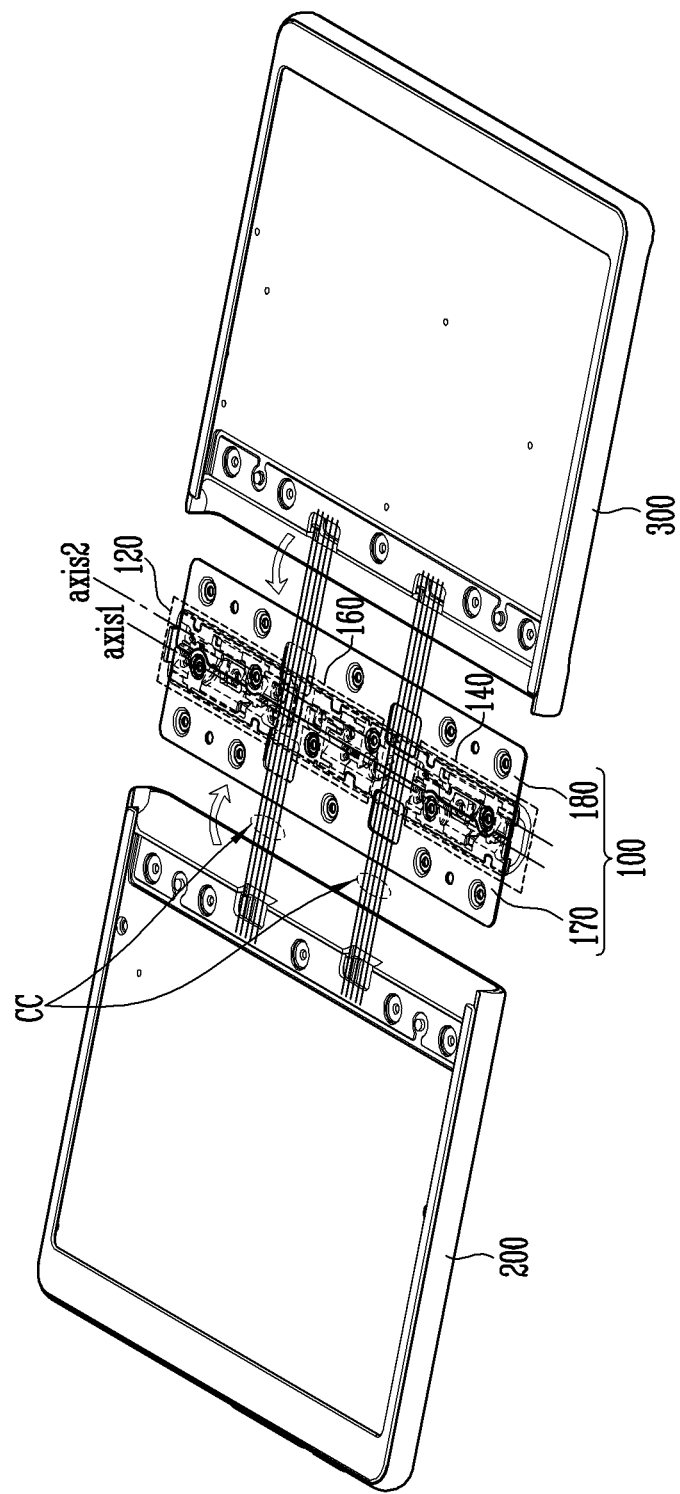
FIG. 4 is a schematic diagram for describing a disposition structure of base hinge devices according to an embodiment of the disclosure.

FIG. 3 is an exploded schematic perspective view for describing components of a hinge device according to an embodiment of the disclosure. FIG. 4 is a schematic diagram for describing a disposition structure of base hinge devices according to an embodiment of the disclosure.

Referring to FIG. 3, the hinge device 100 may include base hinge devices 120, 140, and 160, the first base plate 170, the second base plate 180, and a hinge cover 190.

The base hinge devices 120, 140, and 160 may include first rotors 121, 141, and 161 coupled to the first base plate 170 to rotate along the first virtual rotation axis and second rotors 122, 142, and 162 coupled to the second base plate 180 to rotate along the second virtual rotation axis different from the first virtual rotation axis, respectively.

The first rotors 121, 141, and 161 may be coupled to fastening holes 171, 172, and 173 of the first base plate 170, and the second rotors 122, 142, and 162 may be coupled to fastening holes 181, 182, and 183 of the second base plate 180.

The base hinge devices 120, 140, and 160 may be disposed on a straight line parallel to the first rotation axis and the second rotational axis so as to share the first virtual rotation axis and the second virtual rotational axis. For example, the base hinge devices 120, 140, and 160 may be disposed on a straight line according to the first direction DR1 shown in FIG. 3 (which may correspond to the same direction axis as the first direction according to FIG. 2).

The base hinge devices 120, 140, and 160 may include a first base hinge device 160, a second base hinge device 120, and a third base hinge device 140.

The hinge cover 190 may support the base hinge devices 120, 140, and 160. Therefore, the hinge cover 190 may include fastening holes for coupling to the base hinge devices. For example, the hinge cover 190 may include fastening holes 193a, 193b, 194a, and 194b for coupling to the first base hinge device 160. The hinge cover 190 may include fastening holes 191a, 191b, 192a, and 192b for coupling to the second base hinge device 120. Although not shown in the drawing, the hinge cover 190 may include fastening holes 195a, 195b, 196a, and 196b for coupling to the third base hinge device 140. The hinge cover 190 may be aluminum (Al), but is not limited thereto.

Referring to FIG. 4, the base hinge devices 120, 140, and 160 may include the first base hinge device 160 positioned at a center, and the second base hinge device 120 and the third base hinge device 140 disposed so as to be symmetrical to each other with respect to the first base hinge device 160.

As shown in FIGS. 3 and 4, the hinge device 100 does not necessarily have to comprise three base hinge devices. Base hinge devices of an even number may be disposed so as to be symmetrical to each other with respect to a base hinge device positioned at the center. For example, the hinge device 100 may comprise base hinge devices of an odd number, such as three, five, and seven. In some cases, the base hinge device positioned in the center may be omitted, and the hinge device 100 may comprise base hinge devices of an even number.

The second base hinge device 120 and the third base hinge device 140 may include the same components. The components of the second base hinge device 120 and the third base hinge device 140 may be disposed to be symmetrical (or 180-degree rotationally symmetrical) to each other in a diagonal direction with respect to the first base hinge device 160 positioned at the center. For example, the diagonal direction may refer to diagonal directions DR5 and DR6 within 90 degrees with respect to the first direction DR1 shown in FIG. 3. The first direction DR1 shown in FIG. 3 may be a direction parallel to the first rotation axis and the second rotation axis similarly to the first direction DR1 according to FIG. 2.

In other words, in case that the second base hinge device 120 may be rotated 180 degrees, the second base hinge device 120 may have the same component and the same disposition structure as the third base hinge device 140. For example, the components of the second base hinge device 120 and the third base hinge device 140 may be disposed so as to be 180-degree rotationally symmetrical to each other with respect to the first base hinge device 160 positioned at the center.

Referring to FIG. 4, the base hinge devices 120, 140, and 160 may be spaced apart from each other at regular intervals along a linear direction parallel to the first rotation axis and the second rotation axis.

Therefore, the foldable display device may further include a connection circuit CC that provides a current flow path between the first panel support member 200 and the second panel support member 300 through the regular intervals between the base hinge devices 120, 140, and 160. Specifically, the connection circuit CC may provide a current flow path between the flexible PCB (FPCB) that may be included in the first panel support member 200 and the flexible PCB (FPCB) that may be included in the second panel support member 300. For example, a coated conductive line may pass through an area indicated by the connection circuit CC.

Figure 5:
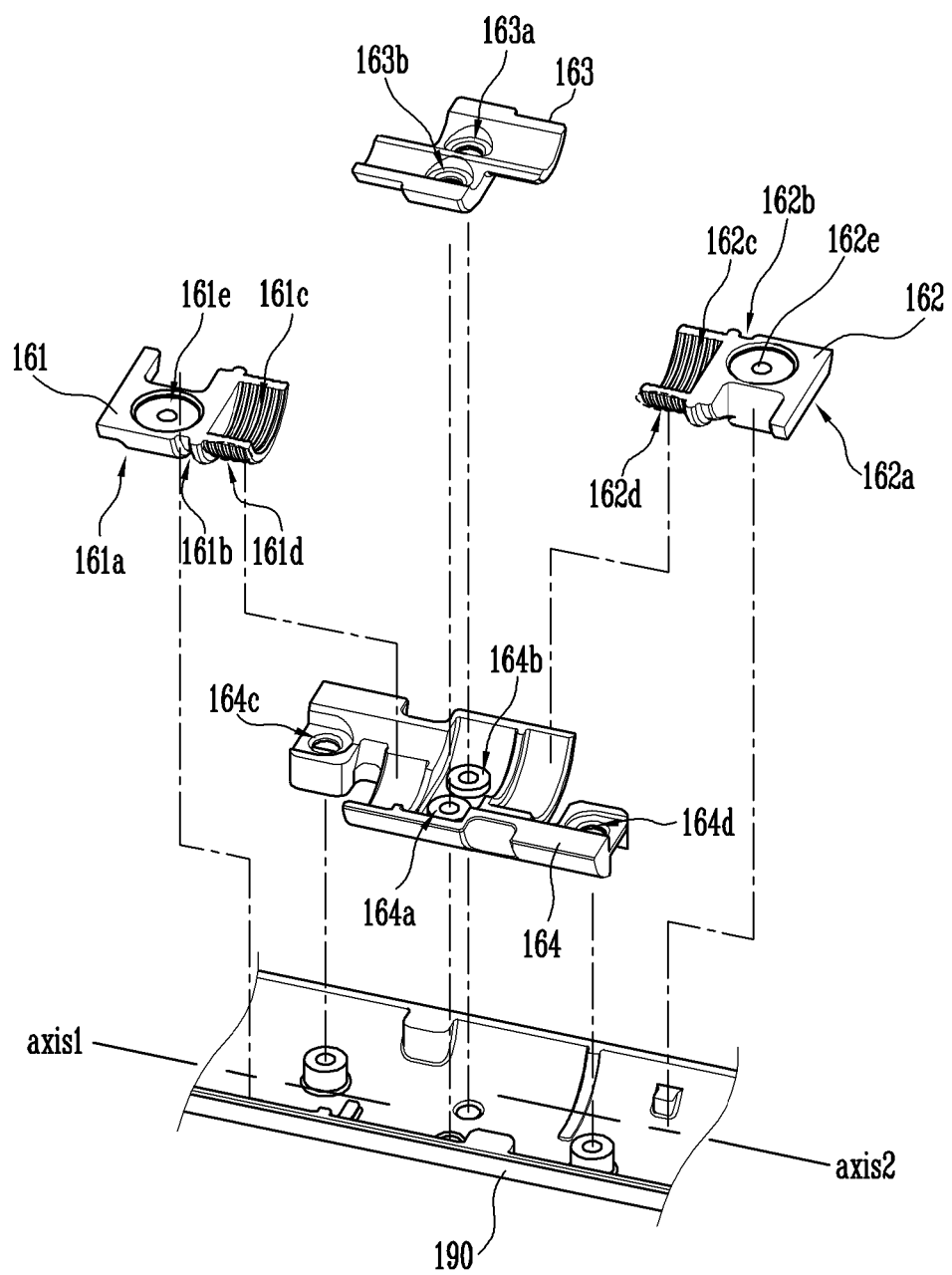
FIG. 5 is an exploded schematic perspective view of a first base hinge device according to an embodiment of the disclosure.

FIG. 5 is an exploded schematic perspective view of the first base hinge device according to an embodiment of the disclosure.

Referring to FIG. 5, the first base hinge device 160 may include a first rotor 161, a second rotor 162, an auxiliary bracket 163, and a bracket 164.

The first rotor 161 may include a curved surface 161a having a diameter corresponding to the first virtual rotation axis, and a groove 161b recessed in an arc shape on the curved surface 161a. The groove 161b recessed in the arc shape on the curved surface 161a may be fitted to the bracket 164 to prevent the first rotor 161 from being deviated from a rotation path according to the first rotation axis.

In particular, the first rotor 161 may further include a torque assist member 161c having a uniform thickness and rectangular surfaces bent along a rotation radius corresponding to the first rotation axis. The torque assist member 161c may be coupled to the first rotor 161 in a form in which a side surface of the first rotor 161 may be extended along the first rotation axis.

The torque assist member 161c may include grooves 161d on at least one surface of the rectangular surfaces. For example, as shown in FIG. 5, the grooves 161d may be included on the rectangular surfaces. Therefore, the first rotor 161 may generate sufficient rotational torque by using the grooves 161d.

The first rotor 161 may further include a fastening hole 161e to be coupled to a first base plate 170. More specifically, the first rotor 161 may further include the fastening hole 161e which may be coupled to fastening hole 172 of the first base plate 170 according to FIG. 3 by a screw, a pin, or the like.

Since the second rotor 162 may have the same shape as the first rotor 161, the description according to the first rotor 161 may be applied to the second rotor 162. However, a fastening hole 162e of the second rotor 162 may be coupled to a second base plate 180. The second rotor 162 may have a curved surface 162b having a diameter corresponding to the second virtual rotation axis. The second rotor 162 may have a shape obtained by rotating the first rotor 161 by 180 degrees and may be disposed on the bracket 164 to be symmetrical to the first rotor 161 in the diagonal direction. The torque assist member 161c of the first rotor 161 and a torque assist member 162c of the second rotor 162 may be disposed to face each other in the diagonal direction. The first rotor 161 and the second rotor 162 may perform rotational movement with respect to different virtual rotation axes through the diagonal direction disposition.

The bracket 164 may support the first rotor 161 and the second rotor 162 on an inner side surface of the hinge cover 190, and may guide the rotational movement of the first rotor 161 and the second rotor 162. The bracket 164 may be the same material (for example, plastic or metal) as the first rotor 161 and the second rotor 162. More specifically, the bracket 164 may be polyoxymethylene or acetal (POM) or stainless steel (STS).

In the bracket 164, a surface that may be in contact with the torque assist members 161c and 162c of the first rotor 161 and the second rotor 162 may be smooth, however, may include grooves having a shape complementary to the grooves 161d and 162d included in the torque assist members 161c and 162c.

The auxiliary bracket 163 may cover the torque assist member 161c of the first rotor 161 and the torque assist member of the second rotor 162 between the first rotor 161 and the second rotor 162 and may form an enclosed space between the grooves 161d and 162d included in the torque assist member 161c of the first rotor 161 and the torque assist member 162c of the second rotor 162, respectively.

For example, the auxiliary bracket 163 may fix the torque assist members 161c and 162c of the first rotor 161 and the second rotor 162 together with the bracket 164 to limit the first rotor 161 and the second rotor 162 being deviated from the rotation radius according to each rotation axis.

The auxiliary bracket 163 may include fastening holes 163a and 163b for coupling to the bracket 164. For example, the auxiliary bracket 163 may include the two fastening holes 163a and 163b for coupling to the bracket 164.

The bracket 164 may further include at least one or more fastening holes 164a and 164b for coupling to the auxiliary bracket 163 and at least one or more fastening holes 164c and 164d for coupling to the hinge cover 190.

Figure 6:
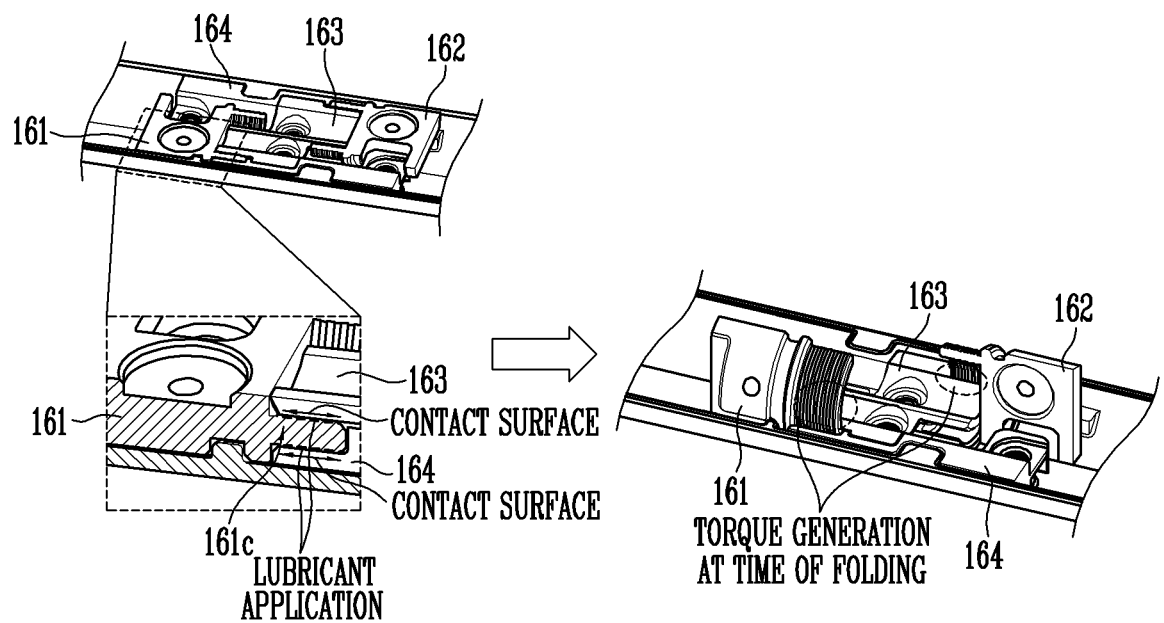
FIG. 6 is a schematic diagram for describing a folding operation of the first base hinge device according to an embodiment of the disclosure.

FIG. 6 is a schematic diagram for describing a folding operation of the first base hinge device according to an embodiment of the disclosure.

Referring to FIG. 6, the first rotor 161 of the first base hinge device may include the torque assist member 161c, and may have grooves on both side surfaces of a rectangular shape of the torque assist member 161c. Contact surfaces of the bracket 164 and the auxiliary bracket 163 that may be respectively in contact with side surfaces of the torque assist member 161c may be smooth without a groove. However, the disclosure is not limited thereto, and the contact surfaces of the bracket 164 and the auxiliary bracket 163 may have grooves complementary to the grooves included in the side surfaces of the torque assist member 161c.

Therefore, the auxiliary bracket 163 may overlap the torque assist member 161c of the first rotor 161 and the torque assist member 162c of the second rotor 162 on the bracket 164 to form the enclosed space between the grooves of the torque assist members. Here, a lubricant may be applied between the bracket and the torque assist members 161c and 162c.

For example, as the lubricant may be applied to the grooves on the both side surfaces of the torque assist member of the first rotor 161 (or the second rotor), in case of folding the foldable display device, torque may be easily generated, wear due to repeated friction may be minimized, and reliability for repeated folding may be maintained.

Figure 7:
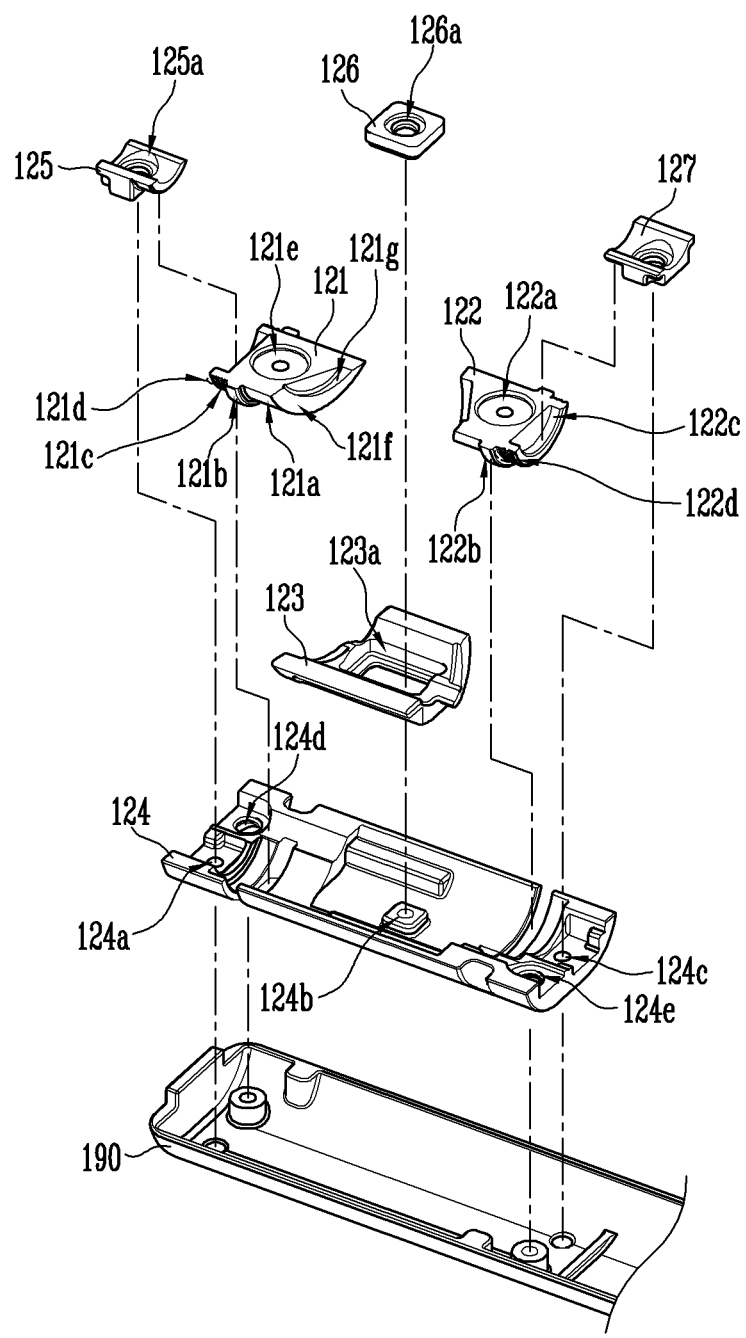
FIG. 7 is an exploded schematic perspective view of a second base hinge device according to an embodiment of the disclosure.

FIG. 7 is an exploded schematic perspective view of a second base hinge device according to an embodiment of the disclosure.

Referring to FIG. 7, the second base hinge device 120 may include a first rotor 121, a second rotor 122, a follower 123, a bracket 124, a first auxiliary bracket 125, a second auxiliary bracket 126, and a third auxiliary bracket 127.

The first rotor 121 may include a curved surface 161a having a diameter corresponding to the first virtual rotation axis axis1, and a surface 121b protruding in an arc shape on the curved surface 161a. The surface 121b protruding in the arc shape on the curved surface 161a may be fitted to the bracket 124 to prevent the first rotor 121 from being deviated from the rotation radius according to the first rotation axis axis1.

In particular, the first rotor 121 may further include a torque assist member 121c having a uniform thickness and rectangular surfaces bent along a rotation radius corresponding to the first rotation axis axis1. The torque assist member 121c may be coupled to the first rotor 121 in a form in which one side surface of the first rotor 161 may be extended along the first rotation axis axis1.

The torque assist member 121c may include grooves 121d on at least one surface of the rectangular both surfaces. For example, as shown in FIG. 7, the grooves 121d may be included on the rectangular surfaces. Therefore, the first rotor 121 may generate sufficient rotational torque by using the grooves 121d.

The first rotor 121 may further include a fastening hole 121e to be coupled to the first base plate 170. More specifically, the first rotor 121 may further include the fastening hole 121e which may be coupled to the fastening hole 171 of the first base plate 170 according to FIG. 3 by a screw, a pin, or the like.

A length at which one side surface of the first rotor 161 according to FIG. 5 (or included in the first base hinge device) extended by the torque assist member 161c may be longer than a length at which one side surface of the first rotor 121 according to FIG. 7 (or included in the second base hinge device) extended by the torque assist member 121c. For example, the first base hinge device 160 may extend the one side surface of the first rotor 161 to be longer by using the torque assist member 161c to generate a strong torque in the center, and the second base hinge device 120 may extend the one side surface of the first rotor 121 to be shorter by using the torque assist member 121c to assist torque generation.

The first auxiliary bracket 125 may overlap the torque assist member 121c of the first rotor 121 to form an enclosed space between the holes 121d that may be included in a curved rectangular surface of the torque assist member 121c of the first rotor 121. The first auxiliary bracket 125 may include a fastening hole 125a for coupling to the fastening hole 124a of the bracket 124.

A side opposite to the side to which the torque assist member 121c may be coupled in the first rotor 121 may have a cross section 121f of a spiral shape, which may be cut in a diagonal direction. The cross section 121f of the spiral shape may have a groove 121g of an arc shape according to the first rotation axis. The follower 123 may be in contact with the groove 121g of the arc shape included in the cross section 121f of the spiral shape. To this end, one side surface of the follower 123 may have a shape complementary to a shape of the groove 121g of the arc shape included in the cross section 121f of the spiral shape. A center portion of the follower 123 may have a hole 123a.

The second auxiliary bracket 126 may be fastened (e.g., directly fastened) to the bracket 124 through the hole 123a of the center portion of the follower 123. More specifically, the second auxiliary bracket 126 may include a fastening hole 126a that may be fastened (e.g., directly fastened) to the fastening hole 124b of the bracket 124 by a screw or the like through the follower 123.

In order to limit the follower 123 from deviating from a linear movement path in a direction parallel to the first rotation axis, the follower 123 may have a wall shape into which the second auxiliary bracket 126 may be inserted, outside the hole 123a. The second auxiliary bracket 126 may be inserted into the hole 123a of the follower 123 through the wall shape, and the follower 123 may be forced (or constrained) to move only in the linear movement path in the direction parallel to the first rotation axis.

The second rotor 122 may have a shape symmetrical to the first rotor 121 with respect to the follower 123. For example, while the first rotor 161 and the second rotor 162 included in the first base hinge device 160 according to FIG. 5 may have the same shape and may be disposed to be symmetrical to each other in the diagonal direction, the first rotor 121 and the second rotor 122 included in the second base hinge device 120 according to FIG. 7 may have shapes that may be symmetrical to each other with respect to the follower 123 and may be disposed to be symmetrical to each other with respect to the follower 123 on the bracket 124.

The bracket 124 may support the first rotor 121 and the second rotor 122 on the inner side surface of the hinge cover 190, and may guide the rotational movement of the first rotor 121 and the second rotor 122. Differently from the bracket 164 of the first base hinge device 160 according to FIG. 3, the bracket 125 according to the second base hinge device 120 may guide a vertical movement of the follower 123.

The bracket 124 may be the same material (for example, plastic or metal) as the first rotor 121, the second rotor 122, and the follower 123. More specifically, the bracket 124 may be polyoxymethylene or acetal (POM) or stainless steel (STS). The linear movement of the follower 123 and the rotational movement of the rotors 121 and 122 may be smoothly guided by configuring the same material to be in contact with each other. The bracket 124 may prevent rotation friction of the rotors 121 and 122 and sliding friction of the follower 126 from being transferred (e.g., directly transferred) to the hinge cover 190.

The bracket 124 may include fastening holes 124d and 124e for coupling to the hinge cover 190. The bracket 124 may include a fastening hole 124b for coupling to the second auxiliary bracket 126, a fastening hole 124a for coupling to the first auxiliary bracket 125, and a fastening hole 124c for coupling to the third auxiliary bracket 127.

Figure 8:
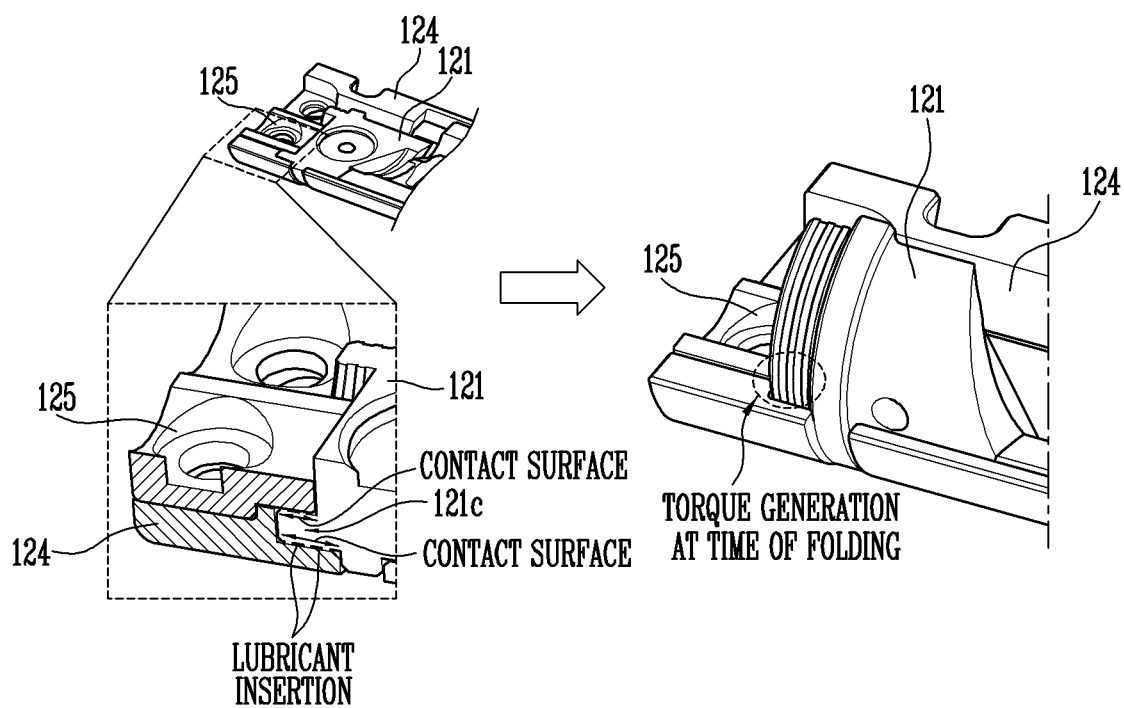
FIG. 8 is a schematic diagram for describing a folding operation of the second base hinge device according to an embodiment of the disclosure.

FIG. 8 is a schematic diagram for describing a folding operation of the second base hinge device according to an embodiment of the disclosure.

Referring to FIG. 8, the first rotor 121 of the second base hinge device may include the torque assist member 121c, and may have grooves on both side surfaces of a rectangular shape of the torque assist member 161c. Contact surfaces of the bracket 124 and the auxiliary bracket 125 that may be respectively in contact with the both side surfaces of the torque assist member 161c may be smooth without a groove. However, the disclosure is not limited thereto, and the contact surfaces of the bracket 124 and the auxiliary bracket 125 may have grooves complementary to the grooves included in the both side surfaces of the torque assist member 121c.

Therefore, the first auxiliary bracket 125 may overlap the torque assist member 121c of the first rotor 121 and the torque assist member 122c (not shown in FIG. 8) of the second rotor 122 on the bracket 124 to form the enclosed space between the grooves of the torque assist members 121c and 122c. Here, a lubricant may be applied between the first auxiliary bracket 125 and the torque assist members 121c and 122c and/or between the bracket 124 and the torque assist members 121c and 122c.

For example, the lubricant may be applied to the grooves on both side surfaces of the torque assist member 121c included in the first rotor 121 (or the second rotor), and in case of folding the foldable display device through the applied lubricant, torque may be easily generated.

The torque assist members 121c and 122c having a width, which may be relatively narrower than that of the torque assist member coupled to the rotors 161 and 162 of the first base hinge device 160 according to FIG. 6, may be coupled to the rotors 121 and 122 of the second base hinge devices 121 and 122 according to FIGS. 7 and 8, and thus a torque generation area (contact surface) may be relatively small. Therefore, the first base hinge device 160 according to FIG. 6 may serve to generate a strong torque at a center of the hinge device 100, and the second base hinge device 120 or the third base hinge device 140 may serve to assist torque generation and possibly support the symmetrical folding operation.

FIG. 9 is a schematic diagram for describing a folding operation of a third base hinge device according to an embodiment of the disclosure.

Referring to FIG. 9, a first rotor 141 of the third base hinge device 140 may rotate along the first rotation axis. Since a spiral cross section formed on the side surface of the first rotor 141 may be in contact with one side surface of a follower, the first rotor 141 may push the follower 143 in the direction horizontal with the first rotation axis. Therefore, the follower 143 that may be pushed by the first rotor 141 may perform vertical movement in a direction horizontal with the first rotation axis. Since the follower 143 may have a hole at the center portion, the follow 143 may perform the liner movement in the direction horizontal with the first rotation axis without being restrained to coupling of a second auxiliary bracket 146.

The follower 143 that may be pushed by the first rotor 141 may push the second rotor 142 adjacent to the first rotor 141 in an opposite direction, in the direction horizontal with the first rotation axis. Since the second rotor 142 may be fixed to the bracket by the third auxiliary bracket, the second rotor 142 may convert force pushed in the horizontal direction into rotational force. Therefore, the second rotor 142 may rotate in a direction opposite to the rotation direction of the first rotor 141 along the second rotation axis. For example, in case that the first rotor 141 rotates up to +90 degrees (or 90 degrees clockwise) about the first rotation axis, the second rotor 142 may rotate up to −90 degrees (or 90 degrees counterclockwise) about the second rotation axis.

As described above, the rotational movement of the first rotor 141 may induce the rotational movement of the second rotor 142 by the follower 143, and thus the first rotor 141 and the second rotor 142 may rotate in opposite directions by the same angle at the same time.

Although the folding operation has been described using the third base hinge device 140 as an example, the same method may be applied to the second base hinge device 120, and detailed description thereof will be omitted in order to prevent repetitive description.

The referred drawings and the detailed description of the disclosure described are merely examples of the disclosure, are used for merely describing the disclosure, and are not intended to limit the meaning and the scope of the disclosure described in the claims. Therefore, those skilled in the art may understand that various modifications and equivalent other embodiments are possible from these. Thus, the true scope of the disclosure should be determined by the technical spirit of the appended claims including any equivalents.

What is claimed is:

1. A foldable display device comprising:
   a display panel including a foldable display area;
   a first panel support member supporting the display panel, the first panel support member overlapping a first area of the display panel;
   a second panel support member supporting the display panel, the second panel support member overlapping a second area of the display panel; and
   a hinge device including base hinge devices coupled to the first panel support member and the second panel support member to guide folding and unfolding of the display panel with respect to virtual rotation axes including a first virtual rotation axis and a second virtual rotation axis with the second virtual rotation axis being different from the first virtual rotation axis.

2. The foldable display device according to claim 1, wherein the hinge device further comprises:
   a first base plate coupled to the first panel support member;
   a second base plate coupled to the second panel support member; and
   a hinge cover supporting the base hinge devices,
   wherein each of the base hinge devices comprises:
      a first rotor coupled to the first base plate to rotate along the first virtual rotation axis of the virtual rotation axes; and
      a second rotor coupled to the second base plate to rotate along the second virtual rotation axis of the virtual rotation axes.

3. The foldable display device according to claim 2, wherein each of the base hinge devices further comprises a bracket supporting the first rotor and the second rotor on an inner side surface of the hinge cover and guiding a rotational movement of the first rotor and the second rotor.

4. The foldable display device according to claim 3, wherein the bracket includes one of polyoxymethylene (POM) and stainless steel (STS).

5. The foldable display device according to claim 3, wherein the base hinge devices comprise a first base hinge device including the first rotor that includes:
   a curved surface having a diameter corresponding to the first rotation axis; and
   a groove recessed in an arc shape on the curved surface.

6. The foldable display device according to claim 5, wherein the groove of the first rotor is fitted to the bracket.

7. The foldable display device according to claim 5, wherein
   the first rotor has a shape bent along a rotation radius corresponding to the first rotation axis, and
   the first rotor includes a torque assist member extending in a direction parallel to the first rotation axis from a side surface of the first rotor.

8. The foldable display device according to claim 7, wherein at least one surface of the torque assist member includes grooves.

9. The foldable display device according to claim 7, wherein the second rotor included in the first base hinge device has the same shape as the first rotor and is disposed on the bracket so as to be rotationally symmetrical to the first rotor.

10. The foldable display device according to claim 9, wherein the first base hinge device further comprises an auxiliary bracket disposed between the first rotor and the second rotor, and overlapping at least a portion of the torque assist member of the first rotor and at least a portion of a torque assist member of the second rotor.

11. The foldable display device according to claim 10, wherein the first base hinge device further comprises a lubricant applied between the auxiliary bracket and the torque assist member of the first rotor or the second rotor.

12. The foldable display device according to claim 3, wherein the base hinge devices comprise a second base hinge device including a first rotor that includes:
   a curved surface having a diameter corresponding to the first rotation axis; and
   a surface protruding in an arc shape on the curved surface.

13. The foldable display device according to claim 12, wherein the first rotor included in the second base hinge device further comprises a torque assist member having a shape bent along a rotation radius corresponding to the first rotation axis and extending in a direction parallel to the first rotation axis from a side surface of the first rotor.

14. The foldable display device according to claim 13, wherein a side surface opposite to the side surface to which the torque assist member is coupled in the first rotor has a cross section of a spiral shape, which is cut in a diagonal direction.

15. The foldable display device according to claim 14, wherein the cross section of the spiral shape has a groove of an arc shape along the first rotation axis.

16. The foldable display device according to claim 15, wherein the second base hinge device further comprises a follower that is fitted into the groove of the cross section of the spiral shape of the first rotor, and is pushed by the rotational movement of the first rotor to produce a linear movement in a direction horizontal to the first rotation axis.

17. The foldable display device according to claim 16, wherein the second rotor included in the second base hinge device has a shape symmetrical to the first rotor with respect to the follower, and is disposed on a side opposite to the first rotor.

18. The foldable display device according to claim 17, wherein the second rotor converts force according to the linear movement of the follower into a rotational force to rotate in a direction opposite to a rotation direction of the first rotor.

19. The foldable display device according to claim 18, wherein the first rotor and the second rotor simultaneously rotate oppositely by a same angle.

20. A hinge device for a foldable display device, the hinge device comprising:
- a first base plate coupled to a first panel support member;
- a second base plate coupled to a second panel support member;
- base hinge devices coupled to the first panel support member and the second support member; and
- a hinge cover supporting the base hinge devices,
- wherein each of the base hinge devices includes:
  - a first rotor coupled to the first base plate to rotate along a first virtual rotation axis;
  - a second rotor coupled to the second base plate to rotate along a second virtual rotation axis with the second virtual rotation axis being different from the first virtual rotation axis; and
  - a bracket supporting the first rotor and the second rotor on an inner side surface of the hinge cover and guiding a rotational movement of the first rotor and the second rotor.

* * * * *